(12) United States Patent
Cho et al.

(10) Patent No.: US 8,905,614 B2
(45) Date of Patent: Dec. 9, 2014

(54) HEAT RADIATING PRINTED CIRCUIT BOARD AND CHASSIS ASSEMBLY HAVING THE SAME

(75) Inventors: Inhee Cho, Seoul (KR); Jaeman Park, Seoul (KR); Hyungyu Park, Seoul (KR); Eunjin Kim, Seoul (KR); Hyuksoo Lee, Seoul (KR); Haehyung Lee, Seoul (KR); Jungho Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 327 days.

(21) Appl. No.: 13/501,974

(22) PCT Filed: Oct. 12, 2010

(86) PCT No.: PCT/KR2010/006962
§ 371 (c)(1),
(2), (4) Date: Jul. 2, 2012

(87) PCT Pub. No.: WO2011/046341
PCT Pub. Date: Apr. 21, 2011

(65) Prior Publication Data
US 2012/0262945 A1   Oct. 18, 2012

(30) Foreign Application Priority Data
Oct. 14, 2009  (KR) .......................... 10-2009-0097692

(51) Int. Cl.
| | | |
|---|---|---|
| *F21V 29/00* | (2006.01) | |
| *H05K 7/20* | (2006.01) | |
| *H05K 1/02* | (2006.01) | |
| *G02F 1/1335* | (2006.01) | |
| *H05K 1/05* | (2006.01) | |
| *F21V 8/00* | (2006.01) | |
| *H05K 3/00* | (2006.01) | |

(52) U.S. Cl.
CPC ........ *G02F 1/133615* (2013.01); *G02B 6/0085* (2013.01); *H05K 1/0284* (2013.01); *G02B 6/0083* (2013.01); *H05K 2203/302* (2013.01); *H05K 3/0061* (2013.01); *H05K 2201/10106* (2013.01); *G02F 2001/133628* (2013.01); *H05K 1/056* (2013.01); *G02F 2001/133601* (2013.01)
USPC .......................................... 362/631; 362/615

(58) Field of Classification Search
CPC ............. G02F 1/1345; G02F 1/13454; G02F 1/13439; G02F 1/1335; F21V 29/004; H05K 7/20954
USPC ................................ 362/631, 630, 97.1, 97.2
See application file for complete search history.

(56) References Cited

U.S. PATENT DOCUMENTS

| | | |
|---|---|---|
| 2008/0007963 A1 | 1/2008 | Hsieh |
| 2009/0109368 A1 | 4/2009 | Watanabe et al. |

(Continued)

FOREIGN PATENT DOCUMENTS

| | | |
|---|---|---|
| CN | 10-1424824 A | 5/2009 |
| JP | 2007-173233 A | 7/2007 |

(Continued)

OTHER PUBLICATIONS

Office Action dated Dec. 22, 2012 in Taiwanese Application No. 099135052, filed Oct. 14, 2010.

(Continued)

*Primary Examiner* — David V Bruce
(74) *Attorney, Agent, or Firm* — Saliwanchik, Lloyd & Eisenschenk

(57) ABSTRACT

The present invention relates to a heat radiating printed circuit board (PCB) and a chassis assembly having the same, the heat-radiating PCB characterized by: a circuit pattern unit; and one or more mounting units bent from the circuit pattern unit to be fixed at a chassis providing a lightguide path of a backlight unit, where the circuit pattern unit includes a driving unit divided into a plurality of driving regions and at least one or more electrodes for supplying a power to the driving unit, and where, the mounting unit is arranged with an electrode line for connecting the driving unit and electrodes other than the electrode arranged on the circuit pattern unit, such that dimming and scanning functions can be performed whereby illumination can be finely controlled, the width of the circuit pattern unit can be narrowed and damage to the PCB caused by heat can be prevented.

19 Claims, 4 Drawing Sheets

(56) References Cited

U.S. PATENT DOCUMENTS

| | | |
|---|---|---|
| 2009/0116262 A1 | 5/2009 | Park |
| 2009/0316104 A1 | 12/2009 | Yang |
| 2013/0194825 A1 | 8/2013 | Nam et al. |

FOREIGN PATENT DOCUMENTS

| | | | |
|---|---|---|---|
| JP | 2008-060070 A | | 3/2008 |
| JP | 2008-108734 A | | 5/2008 |
| JP | 2009-110825 A | | 5/2009 |
| KR | 10-2007-0053517 A | * | 5/2007 |
| KR | 10-2007-0053517 A | | 5/2007 |
| KR | 10-2007-0056346 A | | 6/2007 |
| TW | 200823537 A | | 6/2008 |

OTHER PUBLICATIONS

Office Action dated Oct. 22, 2013 in Japanese Application No. 2012-534104, filed Oct. 12, 2010.

International Search Report in International Application No. PCT/KR2010/006962, filed Oct. 12, 2010.

Office Action dated Apr. 23, 2014 in Chinese Application No. 201080056824.0.

* cited by examiner

HEAT RADIATING PRINTED CIRCUIT BOARD AND CHASSIS ASSEMBLY HAVING THE SAME

CROSS-REFERENCE TO RELATED APPLICATIONS

This application is the U.S. national stage application of International Patent Application No. PCT/KR2010/006962, filed on Oct. 12, 2010, which claims priority to Korean Application No. 10-2009-0097692, filed Oct. 14, 2009, the disclosures of each of which are incorporated herein by reference in their entirety.

TECHNICAL FIELD

The present invention relates to a heat radiating printed circuit board and a chassis assembly having the same.

BACKGROUND ART

The LCD (liquid crystal display) is an electrical element that applies to a display device electrical/optical properties of liquid crystal having intermediate physical properties between a solid and a liquid, and displays an image by controlling the amount of light transmitting the liquid crystal.

That is, the LCD is an electrical element that uses a change in transmissivity of the liquid crystal responsive to an applied voltage and changes various electrical information generated by various devices to visual information and transmits the visual information in visual images.

Since the LCD is not a self-illuminating display device, the LCD essentially requires light from an exterior source to display the images. In order to supply the light to the LCD, the LCD includes a BLU (backlight unit) disposed at a rear surface of the LCD as a light source. The BLU is a composite body including a power source circuit for driving the light source and other accessories providing an even plane light source.

The BLU is mounted with a light source such as an LED (light emitting diode) and a PCB (printed circuit board) largely employs a metal material for sustaining heat radiated from a light source element. However, if the heat generated by the light source element is not properly dissipated, there is a risk of the light source element being broken and shortened in life.

FIG. 1 is a cross-sectional view of a heat-radiating PCB 10 and a blanket 40 mounted at a chassis 50 which is lightguide path of a backlight unit.

Referring to FIG. 1, the blanket 40 for fixing the heat-radiating PCB 10 to the chassis 50 is separately prepared, and bonded using TIM (thermal interface material. 20). That is, the heat-radiating PCB and the blanket are bonded to the chassis used as a lightguide path using the TIM.

However, in a case the heat-radiating PCB 10 and the blanket 40 are separately manufactured and bonded using the TIM 20, there is a disadvantage of the degraded Heat Transfer Coefficient (Ratio) caused by the TIM 20 to decrease the heat-radiating effect.

FIG. 2 is a plan view of a heat-radiating PCB according to prior art.

Referring to FIG. 2, the heat-radiating PCB includes a driving unit 60 driving by being divided into three driving regions 60a, 60b, 60c, a reference electrode 70 commonly supplying a power source to the driving unit 60 and a plurality of individual electrodes 75 supplying a power source to each driving region 60a, 60b, 60c.

The reference electrode 70 and the driving unit 60 are connected to a first electrode line 80 while a first electrode line 85 is connected to the plurality of individual electrodes and the driving regions 60a, 60b, 60c. A driving area 120 includes a plurality of LEDs.

The conventional heat-radiating PCB 10 is configured to have a driving area divided into three driving regions 60a, 60b, 60c, whereby it is difficult to perform dimming and scanning functions and to control the driving regions in a segmented illumination.

The conventional heat-radiating PCB 10 also suffers from disadvantages in that the electrodes 70, 75 and the electrode lines 80, 85 are formed on the same planar surface to increase the width (P) of the PCB 10, making it difficult to miniaturize the PCB, and the life of the PCB can be shortened by the heat generated by the current flowing in the electrode lines 80, 85.

DISCLOSURE OF INVENTION

Technical Problem

The present invention is disclosed to obviate the above-mentioned disadvantages, and it is an object to provide a heat-radiating PCB (printed circuit board) and a chassis assembly having the same capable of integrating the heat-radiating PCB and a blanket for maximization of heat-radiating characteristics, and simplifying the structure for reduced material cost.

It is another object to provide a heat-radiating PCB (printed circuit board) and a chassis assembly having the same capable of segmenting a driving unit to three or more driving regions and performing dimming and scanning functions, whereby illumination can be finely controlled.

It is still another object to provide a heat-radiating PCB (printed circuit board) and a chassis assembly having the same capable of forming electrodes or electrode lines on a planar surface different from that of a circuit pattern unit for a reduced width of the circuit pattern unit, and preventing the PCB from being damaged by heat.

Additional advantages, objects, and features of the present invention will be set forth in part in the description which follows and in part will become apparent to those having ordinary skill in the art upon examination of the following or may be learned from practice of the invention. It is to be understood that both the foregoing general description and the following detailed description of the present invention are exemplary and explanatory and are intended to provide further explanation of the invention as claimed.

Solution to Problem

In one general aspect of the present invention, there is provided a heat-radiating PCB (printed circuit board), characterized by: a circuit pattern unit; and one or more mounting units bent from the circuit pattern unit to be fixed at a chassis providing a lightguide path of a backlight unit, where the circuit pattern unit includes a driving unit divided into a plurality of driving regions and at least one or more electrodes for supplying a power to the driving unit, and where, the mounting unit is arranged with an electrode line for connecting the driving unit and electrodes other than the electrode arranged on the circuit pattern unit.

In some exemplary embodiments, the driving unit may be divided into three or more driving regions.

In some exemplary embodiments, the mounting unit may include a first mounting unit bent from one lateral surface of the circuit pattern unit and a second mounting unit bent from the other lateral surface of the circuit pattern unit, where at least one of the first and second mounting units is mounted at the chassis.

In some exemplary embodiments, individual electrodes may be arranged on a mounting unit that is not mounted to the chassis among the first and second mounting units.

In some exemplary embodiments, the electrode may include a reference electrode supplying a common power to the driving unit, and a plurality of individual electrodes supplying the power to the individual driving unit.

In some exemplary embodiments, the reference electrode may be arranged on the circuit pattern unit, and the individual electrodes may be arranged on any one of the circuit pattern unit or the mounting unit, or may be divisibly arranged on the circuit pattern unit and the mounting unit.

In some exemplary embodiments, a first electrode line connecting the reference electrode and the driving unit may be arranged on the circuit pattern unit, and a second electrode line connecting the individual electrodes and the driving regions may be arranged on the circuit pattern unit and the mounting unit.

In some exemplary embodiments, the mounting unit may be formed by being bent from a lateral surface of the circuit pattern unit to allow the reference electrode and the individual electrodes to be arranged on a mutually different planar surface.

In some exemplary embodiments, one of the plurality of individual electrodes may be arranged on the circuit pattern unit.

In some exemplary embodiments, the circuit pattern unit may be mounted with a metal substrate sequentially formed with an insulation layer and a circuit pattern, and a chip mounting unit mounted with a light emitting diode.

In some exemplary embodiments, the metal substrate may be an Al substrate.

In another general aspect of the present invention, there is provided a chassis assembly, characterized by: a chassis providing a lightguide path of a backlight unit; a circuit pattern unit mounted on the chassis; and one or more heat-radiating PCBs bent from the circuit unit to be fixed at the chassis, where the circuit pattern unit includes a driving unit divided into a plurality of driving regions and at least one or more electrodes for supplying a power to the driving unit, and where, the mounting unit is arranged with an electrode line for connecting the driving unit and electrodes other than the electrode arranged on the circuit pattern unit.

Advantageous Effects of Invention

The heat-radiating PCB (printed circuit board) and a chassis assembly having the same according to the present invention have advantageous effects in that the heat-radiating PCB and a blanket are integrated to prevent degraded heat transfer caused by use of TIM (thermal interface material) and to reduce generation of interface, whereby a thermal conduction degradation phenomenon caused by an air layer can be prevented to maximize the heat-radiating characteristics of the heat-radiating PCB.

Another advantageous effect is that a blanket is integrally manufactured with the heat-radiating PCB to simplify the structure and process by dispensing with separate blanket manufacturing process.

Still another advantageous effect is that a driving unit is divided into three or more driving regions to perform dimming and scanning functions, whereby illumination can be finely controlled.

Still further advantageous effect is that electrodes or electrode lines are formed on a planar surface from that of a circuit pattern unit, i.e., on a mounting unit, to prevent the PCB from being damaged by heat generated by the electrode lines and to reduce a width of the circuit pattern unit, thereby implementing a miniaturized PCB.

MODE FOR THE INVENTION

Figure 1:
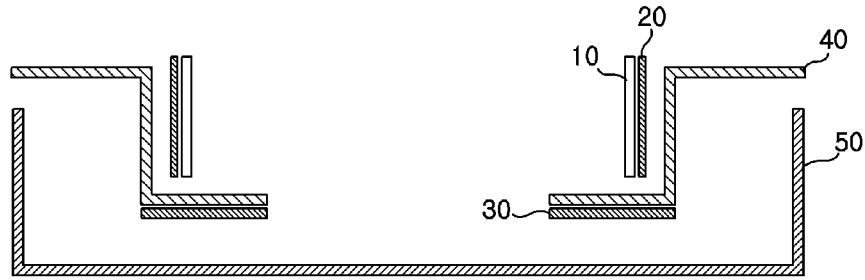
FIG. 1 is a cross-sectional view of a heat-radiating PCB and a blanket mounted at a chassis which is lightguide path of a backlight unit.
Figure 2:
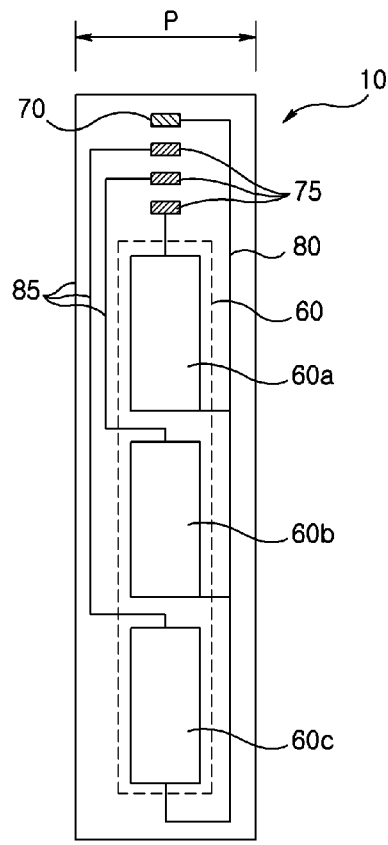
FIG. 2 is a plan view of a heat-radiating PCB according to prior art.

In the drawings, the size and relative sizes of constituent elements may be exaggerated for clarity and convenience. Furthermore, in describing the present disclosure, detailed descriptions of constructions or processes known in the art may be omitted to avoid obscuring appreciation of the invention by a person of ordinary skill in the art with unnecessary detail regarding such known constructions and functions. Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Figure 3:
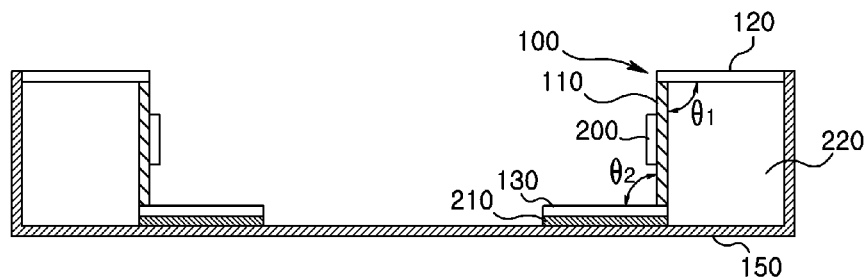
FIG. 3 is a cross-sectional view illustrating a chassis assembly mounted with a heat-radiating PCB according to an exemplary embodiment of the present invention.

FIG. 3 is a cross-sectional view illustrating a chassis assembly mounted with a heat-radiating PCB according to an exemplary embodiment of the present invention.

Referring to FIG. 3, a chassis assembly according to an exemplary embodiment of the present invention includes a chassis 150 and a heat-radiating printed circuit board (PCB. 100) mounted on the chassis 150.

The heat-radiating printed circuit board (PCB. 100) includes a circuit pattern unit 110 and at least one or more mounting units 120,130, where the circuit pattern unit 110 includes a metal substrate sequentially formed with an insulation layer and a circuit pattern, and a chip mounting unit mounted with a light emitting diode 200.

The chip mounting unit mounted at the circuit pattern unit 110 of the heat-radiating PCB 100 is formed with the light emitting diode 200 as a light source for the backlight unit. Although the chip mounting unit is preferably mounted with a light emitting diode as a light emitting source, the embodiment is not limited thereto. The embodiment may be applied to where other light emitting sources are mounted as a light source.

The metal substrate is preferably formed with an aluminum material and the embodiment is not limited thereto. That is, the heat-radiating PCB 100 may be formed in such a manner that an insulation layer and a circuit pattern are sequentially formed on the metal substrate to form a circuit pattern unit, and both ends of the metal substrate is bent to form mounting units 120,130.

The mounting units 120,130 are areas where the circuit pattern unit 110 is not formed, and may include a first mounting unit 120 bent at one lateral surface of the circuit pattern unit 110, and a second mounting unit 130 bent at the other lateral surface of the circuit pattern unit 110.

At least any one of the first and second mounting units 120,130 is secured at a chassis. For example, the first mounting unit 120 may be fixed at a lateral surface of the chassis 150 while the second mounting unit 130 may be fixed at a floor surface of the chassis 150.

The mounting units 120,130 are such that one side of the metal substrate is bent to one direction to form the first mounting unit 120 while the other side of the metal substrate is bent to the other direction to form the second mounting unit 130.

The first mounting unit 120 and the second mounting unit 130 may be bent in opposite direction from each other, or may be bent in the same direction. The second mounting unit 130 is bonded to the floor surface of the chassis 150 using thermal interface material (TIM. 210). An adhesive, a double-sided tape or other bonding materials or configurations may be used to bond the second mounting unit 130 and the chassis 150 in addition to the TIM 120.

In a case the heat-radiating PCB 100 is installed at the chassis 150, a space 220 is formed between the heat-radiating PCB 100 and the chassis 150.

A right angle θ1 is formed between the first mounting unit 120 and the circuit pattern unit 110 and another right angle θ2 is also formed between the second mounting unit 130 and the circuit pattern unit 110. The embodiment is just an example and the angles θ1, θ2 should not be right angles between the two mounting units 120,130 and the circuit pattern unit 110.

As apparent from the foregoing, the heat-radiating PCB according to the present invention is integrally formed with a mounting unit for mounting the PCB to the chassis, whereby a manufacturing process can be simplified to reduce the manufacturing cost, to prevent the heat transfer from being degraded and to maximize the heat-radiating characteristics.

Figure 4:
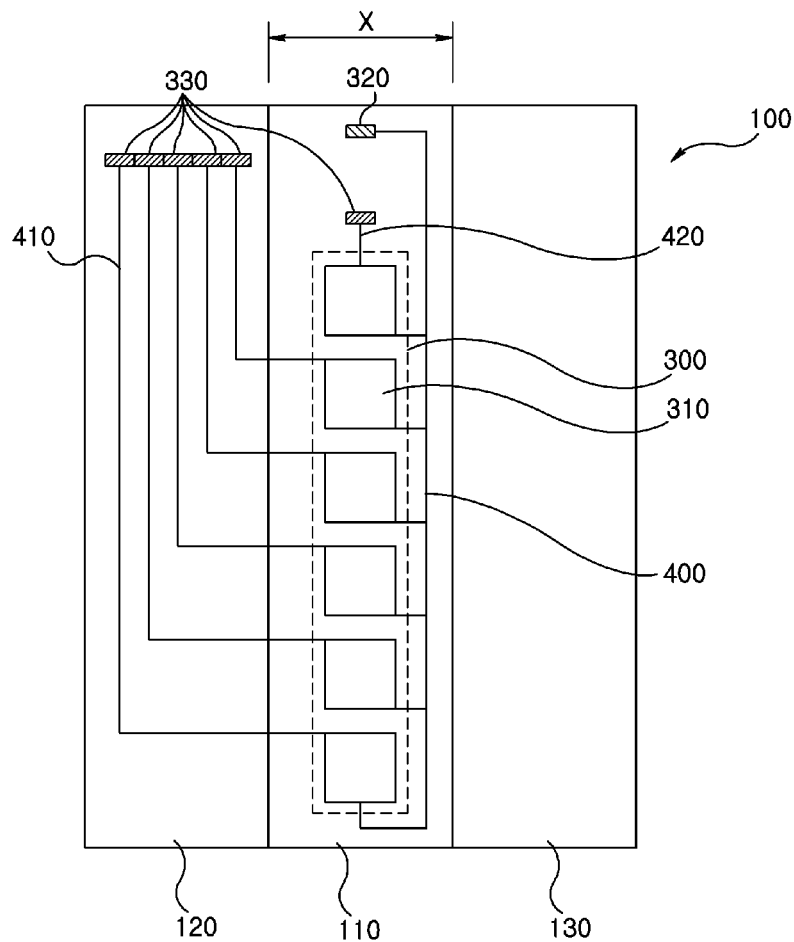
FIG. 4 is a plan view illustrating a state a heat-radiating PCB is unfolded according to an exemplary embodiment of the present invention.

FIG. 4 is a plan view illustrating a state a heat-radiating PCB is unfolded according to an exemplary embodiment of the present invention.

The heat-radiating PCB 100 may include a circuit pattern unit 110 and mounting units 120,130 installed at both lateral surfaces of the circuit pattern unit 110.

The circuit pattern unit 110 may include a driving unit 300 divided into six driving regions 310, a reference electrode 320 and at least one of a plurality of individual electrodes 330. The mounting unit 120 may be installed with remaining individual electrodes 330 other than one individual electrode 330 formed at the circuit pattern unit 110.

The reference electrode 320 is connected to the driving unit 300 and a first electrode line 400 to provide a common power to the driving unit 300. The individual electrode 330 is connected to the driving regions 310 and second electrodes 410, 420 to supply a power to each driving region 310. The driving unit 300 is divided into six driving regions 310 to enable scanning and dimming functions, whereby illumination can be adjusted by segmentation.

Because the circuit pattern unit 110 installed with the driving unit 300 and the mounting unit 120 mounted with the individual electrode 330 are bent to allow the driving unit 300 and the individual electrode 330 to be arranged on a different planar surface, whereby the width X of the circuit pattern unit 110 can be reduced.

Furthermore, the second electrode line 410 connecting the each driving region 310 and the individual electrodes 330 are arranged on the mounting unit 120 to minimize the effect applied on the circuit pattern unit 110 caused by the heat generated by the electrode lines 410.

In a comparative experiment between the heat-radiating PCB according to the exemplary embodiment of the present invention and the heat-radiating PCB according to the prior art, it was noted that the heat-radiating PCB according to the prior art is mounted with a total 72 LEDs and 24 LEDs for each unit segmentation, while the width P of the PCB was 6.3 mm.

However, it was noted that the heat-radiating PCB 100 according to the exemplary embodiment of the present invention is divided into six driving regions 310 with 12 LEDs for each unit segmentation, and the mounting unit 120 is installed with the individual electrodes 330 and the electrode line 410 to reduce the width X of the circuit pattern unit 110 to 4.2 mm.

Figure 5:
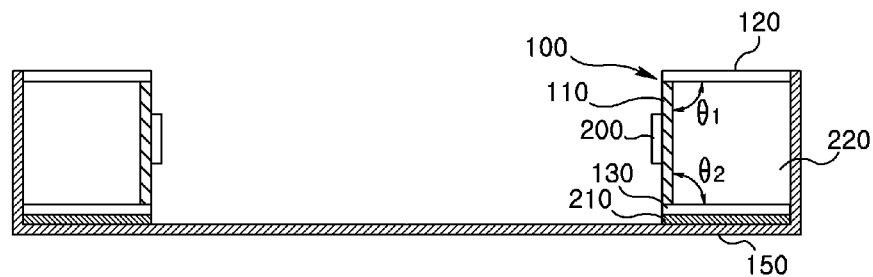
FIG. 5 is a cross-sectional view illustrating a chassis assembly mounted with a heat-radiating PCB according to a second exemplary embodiment of the present invention.

FIG. 5 is a cross-sectional view illustrating a chassis assembly mounted with a heat-radiating PCB according to a second exemplary embodiment of the present invention.

Referring to FIG. 5, the heat-radiating PCB 200 according to the second exemplary embodiment of the present invention may include a circuit pattern unit 110 formed with a circuit pattern, mounting units 120,130 formed by bending both lateral surfaces of the circuit pattern unit 110.

The mounting unit may include a first mounting unit 120 bent from one lateral surface of the circuit pattern unit 110 and a second mounting unit 130 bent from the other lateral surface of the circuit pattern unit 110, where the first and second mounting units may face each other, and an angle θ1 between the first mounting unit and the circuit pattern unit 110 is a right angle and an angle θ2 between the second mounting unit 130 and the circuit pattern unit 110 is also a right angle.

Furthermore, a space 220 is formed between the heat-radiating PCB 100 and the chassis 150, and a chip mounting unit mounted at the circuit pattern unit 110 is installed with a light emitting diode 200 serving as a light source for a backlight unit.

Figure 6:
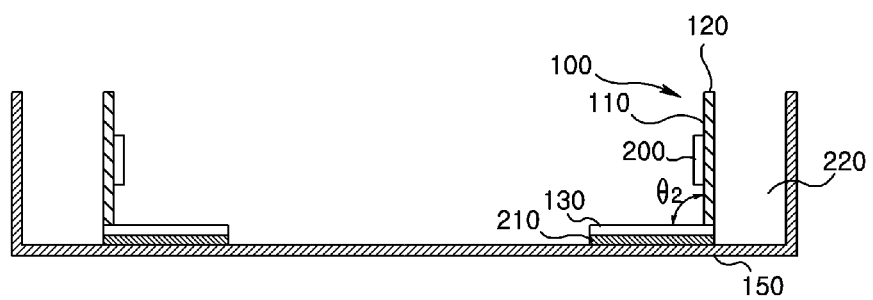
FIG. 6 is a cross-sectional view illustrating a chassis assembly mounted with a heat-radiating PCB according to a third exemplary embodiment of the present invention.

FIG. 6 is a cross-sectional view illustrating a chassis assembly mounted with a heat-radiating PCB according to a third exemplary embodiment of the present invention.

Referring to FIG. 6, the heat-radiating PCB according to the third exemplary embodiment of the present invention is such that a mounting unit 130 installed at the chassis is formed underneath the circuit pattern unit 110 formed by the circuit pattern. The mounting unit 130 is bent at a right angle from the circuit pattern unit 110 and installed at a floor surface of the chassis 150 by way of TIM 120.

An upper side-opened space 220 is formed between the lateral surface of the chassis 150 and the circuit pattern unit 110 and is installed at a bottom end of the chassis 150 by way of TIM 210. A chip mounting unit on the circuit pattern unit 110 is formed with a light emitting diode 200 functioning as a light source for a backlight unit.

Figure 7:
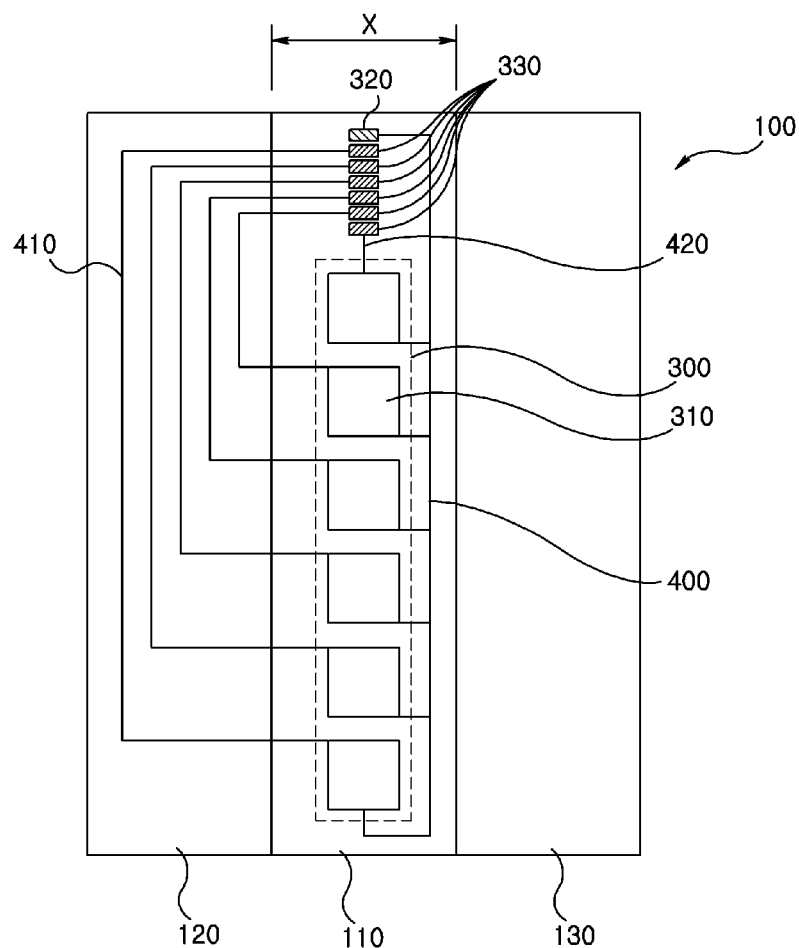
FIG. 7 is a plan view illustrating a state a heat-radiating PCB is unfolded according to another exemplary embodiment of the present invention.

FIG. 7 is a plan view illustrating a state a heat-radiating PCB is unfolded according to another exemplary embodiment of the present invention.

Referring to FIG. 7, the heat-radiating PCB 100 may include a circuit pattern unit 110 and mounting units 120,130 bent from both lateral surfaces of the circuit pattern unit 100.

The circuit pattern unit 110 may include a driving unit 300 divided into six driving regions 310, a reference electrode 320 and individual electrodes 330. The mounting unit 120 may be installed with 5 electrode lines 410 connected to the individual electrodes 330.

Therefore, the reference electrode 320 and the individual electrodes 330 are all arranged on the same planar surface of the circuit pattern unit 110 as that of the driving unit 300, but 5 electrode lines 410 are arranged on the mounting unit 120 away from the circuit pattern unit 110 to reduce the width X of the circuit pattern unit 110. That is, the mounting unit 120 is formed by being bent from one lateral surface of the circuit pattern unit 110 to allow the electrode lines 410 to be positioned on a different planar surface from that of the driving unit 300.

Figure 8:
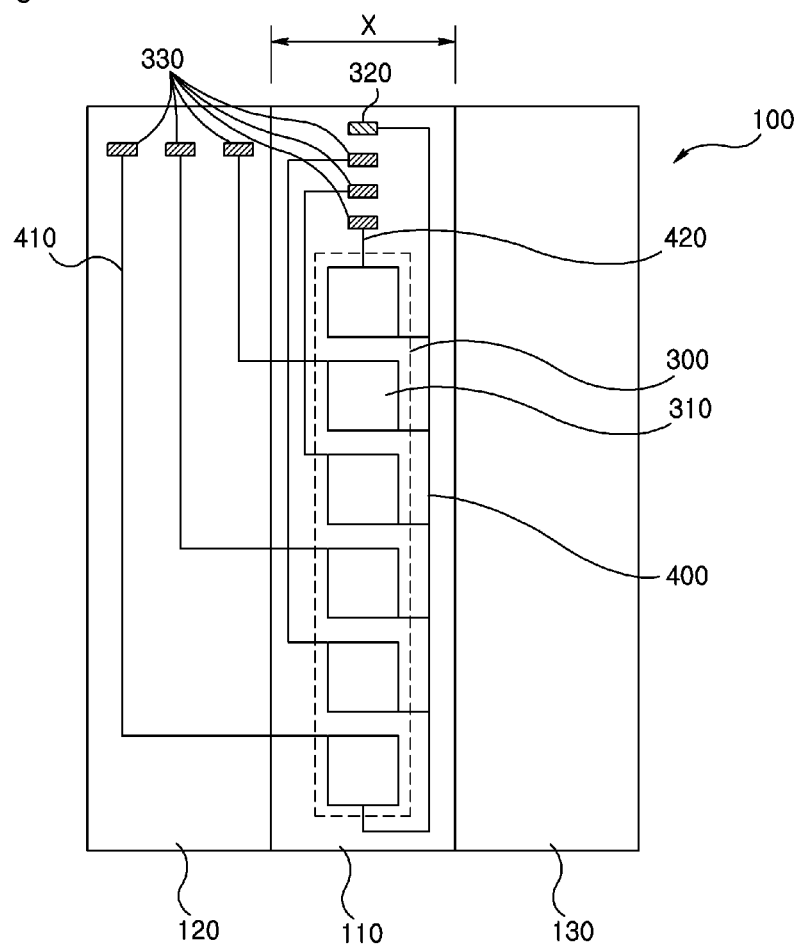
FIG. 8 is a plan view illustrating a state a heat-radiating PCB is unfolded according to still another exemplary embodiment of the present invention.

FIG. 8 is a plan view illustrating a state a heat-radiating PCB is unfolded according to still another exemplary embodiment of the present invention.

Referring to FIG. 8, the heat-radiating PCB 100 may include a circuit pattern unit 110 and mounting units 120,130 bent from both lateral surfaces of the circuit pattern unit 100.

The circuit pattern unit 110 may include a driving unit 300 divided into 6 driving regions 310, a reference electrode 320 and 3 individual electrodes 330 out of a plurality of individual electrodes 330. The mounting unit 120 may be installed with remaining 3 individual electrodes out of the plurality of individual electrodes 330. A connection line 410 connecting the 3 individual electrodes 330 mounted at the mounting unit 120 and the driving regions 310 is formed at the mounting unit 120.

At this time, the individual electrode 320 and part of the electrode line 410 are arranged on a planar surface that is different from that of the driving unit 300 to reduce the width X of the circuit pattern unit 110.

As apparent from FIGS. 6 through 8, in a case the driving unit installed at the circuit pattern unit is divided into three or more driving regions, more diversified power than that of the prior art can be supplied to obtain scanning and dimming functions.

Furthermore, part or all of the reference electrode, individual electrodes and electrode line may be formed at the mounting unit having a different planar surface from that of the circuit pattern unit to adjust the width X of the circuit pattern unit.

While the present disclosure has been particularly shown and described with reference to exemplary embodiments thereof, the general inventive concept is not limited to the above-described embodiments. It will be understood by those of ordinary skill in the art that various changes and variations in form and details may be made therein without departing from the spirit and scope of the present invention as defined by the following claims.

Industrial Applicability

The heat-radiating PCB (printed circuit board) and a chassis assembly having the same according to the present invention have an industrial applicability in that the heat-radiating PCB and a blanket are integrated to prevent degraded heat transfer caused by use of TIM (thermal interface material) and to reduce interface generation, whereby a thermal conduction degradation phenomenon caused by an air layer can be prevented to maximize the heat-radiating characteristics of the heat-radiating PCB.

Another industrial applicability is that a blanket is integrally manufactured with the heat-radiating PCB to simplify the structure and process by dispensing with separate blanket manufacturing process.

Still another industrial applicability is that a driving unit is divided into three or more driving regions to perform dimming and scanning functions, whereby illumination can be finely controlled.

Still further industrial applicability is that electrodes or electrode lines are formed on a planar surface from that of a circuit pattern unit, i.e., on a mounting unit, to prevent the PCB from being damaged by heat generated by the electrode lines and to reduce a width of the circuit pattern unit, thereby implementing a miniaturized PCB.

The invention claimed is:

1. A heat-radiating printed circuit board (PCB), comprising:
   a circuit pattern unit;
   one or more mounting units bent from the circuit pattern unit;
   a driving unit formed at the circuit pattern unit and divided into a plurality of driving regions;
   a reference electrode arranged on the circuit pattern unit and supplying a common power to the driving unit;
   a plurality of individual electrodes arranged on the circuit pattern unit or the mounting units, wherein the plurality of individual electrodes supplies a power to the plurality of driving regions, respectively;
   a first electrode line arranged on the circuit pattern unit, connecting the reference electrode with the driving unit; and
   a plurality of second electrode lines arranged on the mounting units, connecting the plurality of individual electrodes with the plurality of driving regions, respectively.

2. The heat-radiating PCB of claim 1, wherein the driving unit is divided into three or more driving regions.

3. The heat-radiating PCB of claim 1, wherein the mounting units include a first mounting unit bent from one lateral surface of the circuit pattern unit and a second mounting unit bent from the other lateral surface of the circuit pattern unit.

4. The heat-radiating PCB of claim 1, wherein the individual electrodes are arranged on the circuit pattern unit or the mounting units or are divisibly arranged on the circuit pattern unit and the mounting units.

5. The heat-radiating PCB of claim 1, wherein the mounting units comprise a metal substrate and the circuit pattern unit comprises the metal substrate, an insulation layer on the metal substrate, and a circuit pattern.

6. The heat-radiating PCB of claim 5, wherein the insulation layer and the circuit pattern are sequentially formed on the metal substrate.

7. The heat-radiating PCB of claim 6, wherein the insulation layer is formed only on the circuit pattern unit.

8. The heat-radiating PCB of claim 5, wherein the metal substrate includes an Al substrate.

9. The heat-radiating PCB of claim 1, wherein the second electrode lines include a parallel portion parallel to a long side of the metal substrate, and a connecting portion connected to the driving regions and bent in a direction different from that of the parallel portion; and wherein the parallel portion is arranged on the mounting units and not arranged on the circuit pattern unit.

10. A chassis assembly, comprising:
    a chassis providing a light guide path of a backlight unit; and
    one or more heat-radiating PCBs mounted on the chassis, comprising:

a circuit pattern unit;

one or more mounting units bent from the circuit pattern unit to fix at the chassis;

a driving unit formed at the circuit pattern unit and divided into a plurality of driving regions;

a reference electrode arranged on the circuit pattern unit and supplying a common power to the driving unit;

a plurality of individual electrodes arranged on the circuit pattern unit or the mounting units, wherein the plurality of individual electrode supplies a power to the plurality of driving regions, respectively;

a first electrode line arranged on the circuit pattern unit, connecting the reference electrode with the driving unit; and a plurality of second electrode lines arranged on the mounting units, connecting the plurality of individual electrodes with the plurality of driving regions, respectively.

11. The chassis assembly of claim 10, wherein the driving unit is divided into three or more driving regions.

12. The chassis assembly of claim 10, wherein the mounting units include a first mounting unit bent from one lateral surface of the circuit pattern unit and a second mounting unit bent from the other lateral surface of the circuit pattern unit, wherein at least one of the first and second mounting units is mounted at the chassis.

13. The chassis assembly of claim 10, wherein a space is formed between the chassis and the circuit pattern unit by mounting the mounting units at the chassis.

14. The chassis assembly of claim 10, wherein the plurality of individual electrodes are arranged on the circuit pattern unit.

15. The chassis assembly of claim 10, wherein the individual electrodes are arranged on the circuit pattern unit or the mounting units or are divisibly arranged on the circuit pattern unit and the mounting units.

16. The chassis assembly of claim 10, wherein the mounting units comprise a metal substrate and the circuit pattern unit comprises a metal substrate, an insulation layer on the metal substrate, and a circuit pattern.

17. The chassis assembly of claim 16, wherein the insulation layer directly contacts with the metal substrate.

18. The chassis assembly of claim 10, wherein the second electrode lines include a parallel portion parallel to a long side of the metal substrate, and a connecting portion connected to the driving regions bent in a direction different from that of the parallel portion, wherein the parallel portion is arranged on the mounting units and not arranged on the circuit pattern unit.

19. The chassis assembly of claim 10, wherein the metal substrate includes an Al substrate.

* * * * *